US010515586B2

United States Patent
Zhu et al.

(10) Patent No.: US 10,515,586 B2
(45) Date of Patent: Dec. 24, 2019

(54) DISPLAY DEVICE HAVING AUXILIARY ELECTRODES IN SWITCHING TRANSISTORS

(71) Applicant: WUHAN TIANMA MICRO-ELECTRONICS CO., LTD., Wuhan (CN)

(72) Inventors: Zaiwen Zhu, Xiamen (CN); Hong Lin, Xiamen (CN); Shui He, Xiamen (CN); Sera Kenji, Xiamen (CN); Isao Shoji, Xiamen (CN); Zhonglan Cai, Shanghai (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 15/895,552

(22) Filed: Feb. 13, 2018

(65) Prior Publication Data
US 2018/0182292 A1 Jun. 28, 2018

(30) Foreign Application Priority Data

Jul. 17, 2017 (CN) .......................... 2017 1 0582226

(51) Int. Cl.
*G09G 3/30* (2006.01)
*G09G 3/3233* (2016.01)
*H01L 51/52* (2006.01)
*H01L 27/32* (2006.01)
*G09G 3/3208* (2016.01)

(52) U.S. Cl.
CPC ....... *G09G 3/3233* (2013.01); *H01L 27/3265* (2013.01); *H01L 51/5203* (2013.01); *G09G 3/3208* (2013.01); *G09G 2300/0852* (2013.01); *G09G 2310/0243* (2013.01); *G09G 2310/0251* (2013.01); *G09G 2310/0262* (2013.01); *H01L 27/3262* (2013.01)

(58) Field of Classification Search
CPC ................ G09G 3/3233; G09G 3/3208; H01L 27/3262; H01L 27/3265; H01L 51/5203
USPC .......................................... 345/76; 315/169.3
See application file for complete search history.

(56) References Cited

U.S. PATENT DOCUMENTS

2015/0048320 A1* 2/2015 Lee ...................... H01L 27/1255
257/40
2015/0123084 A1* 5/2015 Kim ...................... H01L 27/326
257/40

(Continued)

FOREIGN PATENT DOCUMENTS

CN 104659285 A 5/2015
JP 129890 A 5/1997

*Primary Examiner* — Adam J Snyder
(74) *Attorney, Agent, or Firm* — Alston & Bird LLP

(57) ABSTRACT

The present disclosure discloses a display panel and a display device. The display panel includes pixel circuits arranged in an array. Each pixel circuit includes a driving transistor, at least two switching transistors and at least two first auxiliary electrodes arranged in a one to one relationship to the switching transistors. By electrically connecting each of the first auxiliary electrodes with a gate of a related switching transistor, the first auxiliary electrode and the gate of the corresponding switching transistor have a same potential. A capacitor can be formed between the first auxiliary electrode and the active layer, and a capacitor is formed between the gate and the active layer.

11 Claims, 11 Drawing Sheets

(56) References Cited

U.S. PATENT DOCUMENTS

| | | | |
|---|---|---|---|
| 2015/0379923 A1* | 12/2015 | Lee | G09G 3/3233 |
| | | | 345/206 |
| 2016/0013256 A1* | 1/2016 | Gai | G09G 3/32 |
| | | | 257/40 |
| 2016/0027814 A1* | 1/2016 | Jin | H01L 27/1255 |
| | | | 257/296 |
| 2016/0322450 A1* | 11/2016 | Lee | G09G 3/3233 |
| 2016/0379562 A1* | 12/2016 | Yoon | G09G 3/3233 |
| | | | 345/215 |
| 2017/0018652 A1* | 1/2017 | Liu | H01L 27/02 |
| 2017/0047390 A1* | 2/2017 | Lee | G09G 3/3233 |
| 2017/0110049 A1* | 4/2017 | Choi | G09G 3/2092 |
| 2018/0151650 A1* | 5/2018 | Ha | G09G 3/3233 |

\* cited by examiner

_US 10,515,586 B2_

DISPLAY DEVICE HAVING AUXILIARY ELECTRODES IN SWITCHING TRANSISTORS

CROSS-REFERENCE TO RELATED APPLICATIONS

This application claims the priority to Chinese Patent Application No. CN201710582226.0, filed on Jul. 17, 2017, the content of which is hereby incorporated by reference in its entirety.

FIELD

The present disclosure relates to the technical field of display, in particular to a display panel and a display device.

BACKGROUND

An Organic Light Emitting Diode (OLED) display is a current-driven display and needs to be driven by a stable current to emit light. For reasons such as those occurring in a manufacturing process or from device aging, a pixel compensation circuit capable of compensating a threshold voltage (Vth) of a driving transistor is generally used in the OLED display to drive OLED to emit light. By compensating the threshold voltage, a problem of display non-uniformity caused by a drift of the threshold voltage of the driving transistor can be effectively improved.

However, how to further improve uniformity of a displayed image based on the existing pixel compensation circuit is a technical problem which needs to be solved by one skilled in the art urgently.

SUMMARY

An embodiment of the present disclosure provides a display panel and a display device to solve the problem of how to improve uniformity of a displayed image.

The embodiment of the present disclosure provides a display panel. The display panel includes a plurality of pixel circuits arranged in an array. Each of the plurality of pixel circuits includes a driving transistor, at least two switching transistors, at least two first auxiliary electrodes each arranged in a one to one relationship with an associated one of the at least two switching transistors. Each of the at least two first auxiliary electrodes is electrically connected with a gate of an associated switching transistor. A capacitor is formed in an overlapping area between one of the at least two first auxiliary electrodes and an active layer in the associated switching transistor.

In one possible implementation mode, in the display device according to the embodiment of the present disclosure, a first capacitor is formed in an overlapping area between one of the at least two first auxiliary electrode and an active layer next to a source in the associated switching transistor.

In one possible implementation mode, in the display device according to the embodiment of the present disclosure, a second capacitor is formed in an overlapping area between one of the at least two first auxiliary electrodes and an active layer next to a drain in the associated switching transistor.

In one possible implementation mode, in the display device according to the embodiment of the present disclosure, each of the at least two first auxiliary electrodes is electrically connected with the gate of the associated switching transistor through a via hole.

In one possible implementation mode, in the display device according to the embodiment of the present disclosure, the gate of each of the at least two switching transistors is located in a film layer between an active layer and a source/drain of the switching transistor. The gate of the driving transistor is located in a film layer between the active layer and the source/drain of the driving transistor. And each of the at least two first auxiliary electrodes is made of a same material and is provided in a same layer as the source/drain of the associated switching transistor.

In one possible implementation mode, in the display device according to the embodiment of the present disclosure, the second auxiliary electrode is provided in a film layer between the gate and the source/drain of the driving transistor.

In one possible implementation mode, in the display device according to the embodiment of the present disclosure, the gate of each of the at least two switching transistors is located in a film layer between the active layer and a source/drain of said switching transistor. The gate of the driving transistor is located in a film layer between an active layer and a source/drain of the driving transistor. Each of the at least two first auxiliary electrodes is provided in a film layer between the gate and the source/drain of the associated switching transistor.

In one possible implementation mode, in the display device according to the embodiment of the present disclosure, the gate of each of the at least two switching transistors is located in a film layer between an active layer in the switching transistor and the underlying substrate. The gate of the driving transistor is located in a film layer between an active layer in the driving transistor and the underlying substrate. And the first auxiliary electrode is provided in a film layer between the underlying substrate and the gate of the corresponding switching transistor.

In one possible implementation mode, in the display device according to the embodiment of the present disclosure, each of the at least two first auxiliary electrodes and the second auxiliary electrode are made of a same material and are provided in a same layer.

The embodiment of the present disclosure further provides a display device. The display device includes a display panel. The display panel includes a plurality of pixel circuits arranged in an array. Each of the plurality of pixel circuits includes a driving transistor; at least two switching transistors; and at least two first auxiliary electrodes each arranged in a one to one relationship with an associated one of the at least two switching transistors. Each of the at least two first auxiliary electrodes is electrically connected with a gate of an associated switching transistor; and a capacitor is formed in an overlapping area between the first auxiliary electrode and an active layer in the associated switching.

DETAILED DESCRIPTION OF EMBODIMENTS

Figure 1:
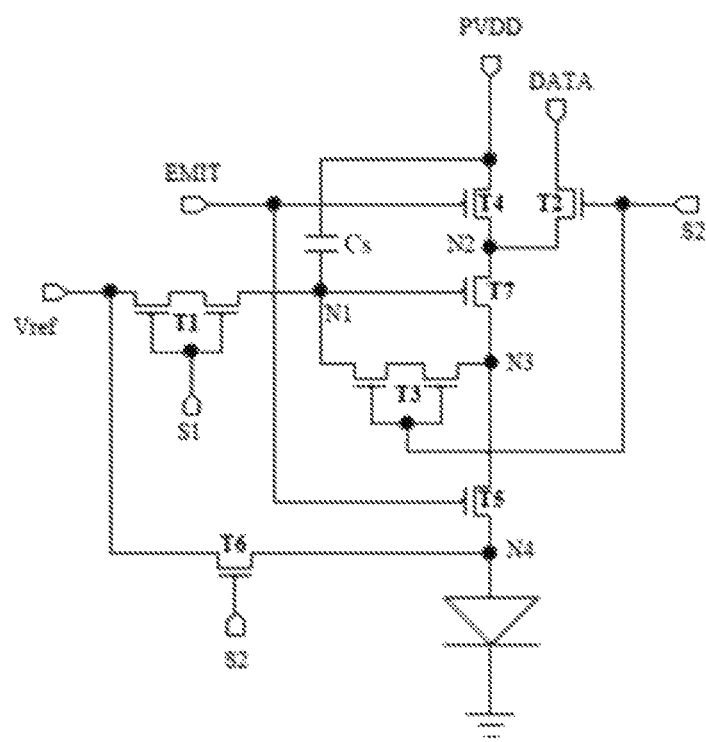
FIG. 1 illustrates a schematic diagram of a pixel compensation circuit according to an embodiment of the present disclosure.

Specific implementation modes of a display panel and a display device according to the embodiments of the present disclosure are described below in detail with reference to the drawings. It is noteworthy that the described embodiment is not the only embodiment of the present disclosure. All other embodiments obtained by one skilled in the art based on the embodiment of the present disclosure without contributing any inventive labor shall fall into the protection scope of the present disclosure.

In order to further improve uniformity of an image displayed by an OLED display, subthreshold swings of a driving transistor and a switching transistor may be adjusted. A subthreshold swing refers to a gate voltage increment needed for a current of a drain to change by an order of magnitude, i.e., when a voltage changes a same amount, the smaller an amount of change of the current, the greater the value of the subthreshold swing and the more uniform the displayed image. Therefore, by increasing the subthreshold swing of the driving transistor or decreasing the subthreshold swing of the switching transistor, the uniformity of the displayed image can be improved.

In addition, according to the definition of the subthreshold swing and a theoretical calculation, it can be seen that a subthreshold swing of a transistor has a certain corresponding relationship with gate capacitance, as shown in formula (1) and formula (2). Formula (2) can be obtained by deriving formula (1), where ID represents a drain current of the transistor, W represents a depth of a channel of the transistor, L represents a length of the channel of the transistor, μ represents charge carrier mobility in an active layer of the transistor, $V_g$ represents a gate voltage of the transistor, $V_{th}$ represents a threshold voltage of the transistor, $V_D$ represents a drain voltage of the transistor, and C represents the gate capacitance. Also, in formula (2), the left side of the equation represents a subthreshold swing, and the right side of the equation represents a relationship of the parameters.

$$I_D = \frac{W}{L} \cdot \mu \cdot C \cdot \left[ (V_g - V_{th}) \cdot V_D - \frac{1}{2} \cdot V_D^2 \right] \quad (1)$$

$$\frac{\partial V_g}{\partial I_D} = \frac{L}{W \cdot \mu \cdot C \cdot V_D} \quad (2)$$

Therefore, from formula (2) it can be seen that when the gate capacitance C of the transistor increases, the subthreshold swing of the transistor decreases; when the gate capacitance C of the transistor decreases, the subthreshold swing of the transistor increases; and meanwhile, the subthreshold swing of the transistor affects the uniformity of the displayed image, i.e., when the voltage changes a same amount, the smaller the amount of change of the drain current, the greater the value of the subthreshold swing of the driving transistor and the more uniform the displayed image. Based on this, the embodiment of the present disclosure provides a pixel circuit, which decreases a subthreshold swing of each switching transistor by increasing gate capacitance of each switching transistor, indirectly increases the subthreshold swing of the driving transistor, and thus improves the uniformity of the entire displayed image.

Specifically, the pixel circuit according to the embodiment of the present disclosure is illustrated in FIG. 1, and schematic diagrams of hierarchical structures of a part of the pixel circuit corresponding to FIG. 1 are illustrated in FIG. 2 to FIG. 6. The pixel circuit may include a driving transistor 10, at least two switching transistors 20 and at least two first auxiliary electrodes 30 corresponding to the switching transistors 20 in a one to one relationship. FIG. 2 to FIG. 6 only illustrate hierarchical structures of one switching transistor 20 and the driving transistor 10.

A first auxiliary electrode 30 is electrically connected with a gate 21 of a corresponding switching transistor 20. An orthogonal projection of the first auxiliary electrode 30 on an underlying substrate 40 and an orthogonal projection of an active layer 22 of the corresponding switching transistor 20 on the underlying substrate 40 have an overlapping area, and a capacitor is formed between the first auxiliary electrode 30 and the active layer 22 in the overlapping area.

Figure 7:
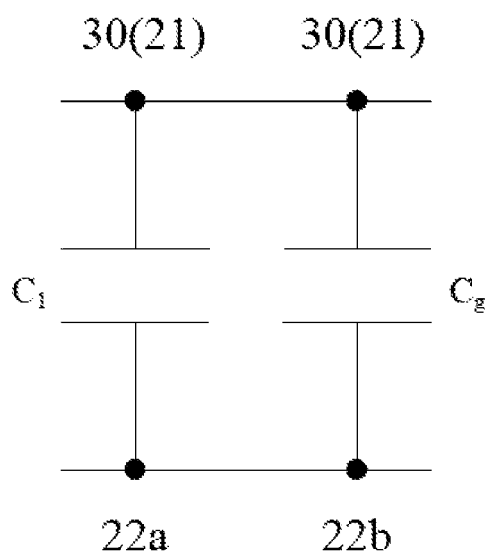
FIG. 7 illustrates a schematic diagram of components of gate capacitor assembly in a switching transistor according to an embodiment of the present disclosure.
Figure 8:
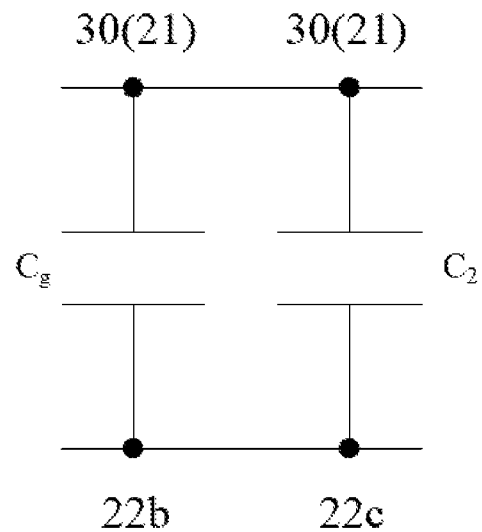
FIG. 8 illustrates a schematic diagram of components of gate capacitor assembly in a switching transistor according to an embodiment of the present disclosure.
Figure 9:
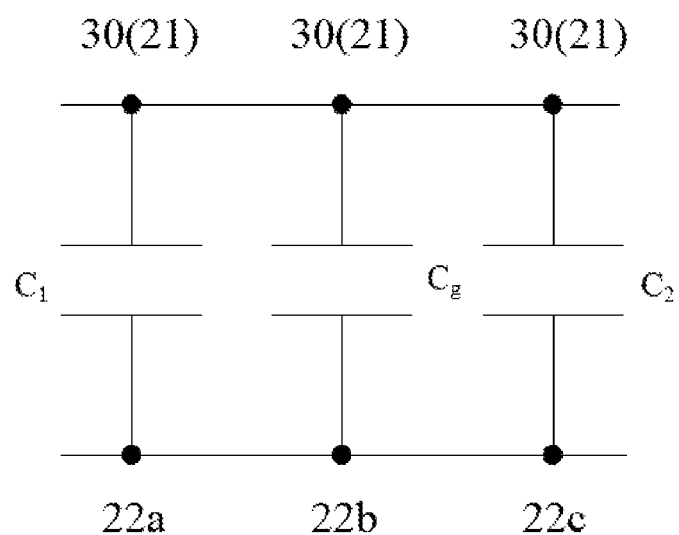
FIG. 9 illustrates a schematic diagram of components of gate capacitor assembly in a switching transistor according to an embodiment of the present disclosure.

In the pixel circuit according to the embodiment of the present disclosure, by electrically connecting the first auxiliary electrode 30 with the gate 21 of the corresponding switching transistor 20, the first auxiliary electrode 30 and the gate 21 of the corresponding switching transistor 20 have a same potential. Since the potential of the active layer 22 is different from the potential of the gate 21, a capacitor ($C_1$ and/or $C_2$ as illustrated in FIG. 7 to FIG. 9) can be formed between the first auxiliary electrode 30 and the active layer 22, and a capacitor ($C_g$ as illustrated in FIG. 7 to FIG. 9) can also be formed between the gate 21 and the active layer 22, such as to form a parallel gate capacitor $C_m$ (a specific calculation process of $C_m$ is described below). In the driving transistor 10, since no first auxiliary electrode electrically connected with the gate 11 exists, the total gate capacitance $C_n$ (a specific calculation process of $C_n$ is described below) after serial connection in the driving transistor 10 is smaller than the total gate capacitance $C_m$ after parallel connection in the switching transistors 20, such that the subthreshold swing of the driving transistor 10 is greater than the subthreshold swings of each switching transistor 20, and thereby the uniformity of the displayed image is improved.

During actual implementation, there may be various modes for realizing that the orthogonal projection of each first auxiliary electrode on the underlying substrate and the orthogonal projection of the active layer of the corresponding switching transistor on the underlying substrate have an overlapping area. Therefore, in the pixel circuit according to the embodiment of the present disclosure, as illustrated in FIG. 2 to FIG. 6, the orthogonal projection of the first auxiliary electrode 30 on the underlying substrate 40 and the orthogonal projection of the active layer 22a closest to a source 23a in the corresponding switching transistor 20 on the underlying substrate 40 have a first overlapping area, and a first capacitor $C_1$ is formed between the first auxiliary electrode 30 and the active layer (i.e., the active layer 22a closest to the source 23a) in the first overlapping area.

And/or, the orthogonal projection of the first auxiliary electrode 30 on the underlying substrate 40 and the orthogonal projection of the active layer 22c closest to a drain 23b of the corresponding switching transistor 20 on the underlying substrate 40 have a second overlapping area, and a second capacitor $C_2$ is formed between the first auxiliary electrode 30 and the active layer (i.e., the active layer 22c closest to the drain 23b) in the second overlapping area.

Figure 2:
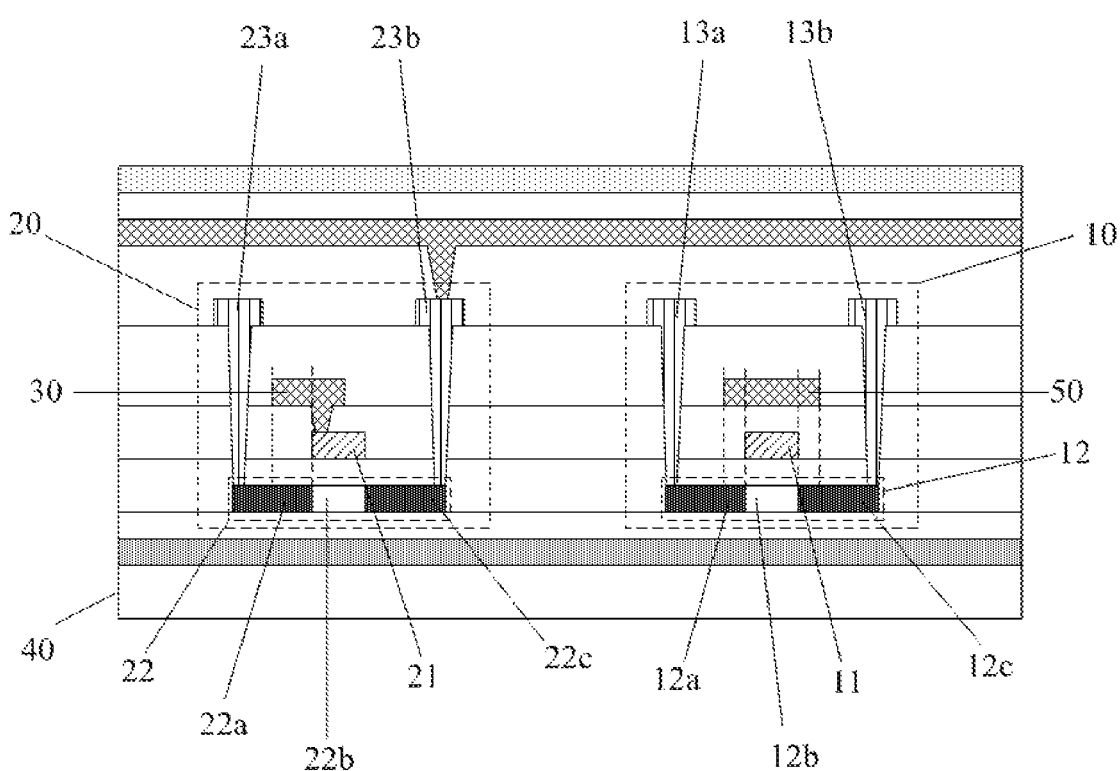
FIG. 2 illustrates a cross sectional view of a part of a pixel circuit according to one embodiment of the present disclosure.

Specifically, in the first case, a schematic diagram of components of a gate capacitor corresponding to a structure illustrated in FIG. 2 is illustrated in FIG. 7, the orthogonal projection of the first auxiliary electrode 30 on the underlying substrate 40 and the orthogonal projection of the active layer 22a closest to the source 23a in the corresponding switching transistor 20 on the underlying substrate 40 have a first overlapping area, such that the first capacitor $C_1$ is formed between the first auxiliary electrode 30 and the active layer (i.e., the active layer 22a closest to the source 23a) in the first overlapping area. Since a capacitor $C_g$ is also formed between the gate 21 and the active layer (i.e., a portion 22b of the active layer 22 opposite the gate 21), the first capacitor $C_1$ and the capacitor $C_g$ form a parallel capacitor. Since parallel capacitance is equal to a sum of capacitance of both capacitors, when $C_{m1}$ represents gate capacitance of the switching transistor 20, $C_{m1}=C_1+C_g$.

Figure 3:
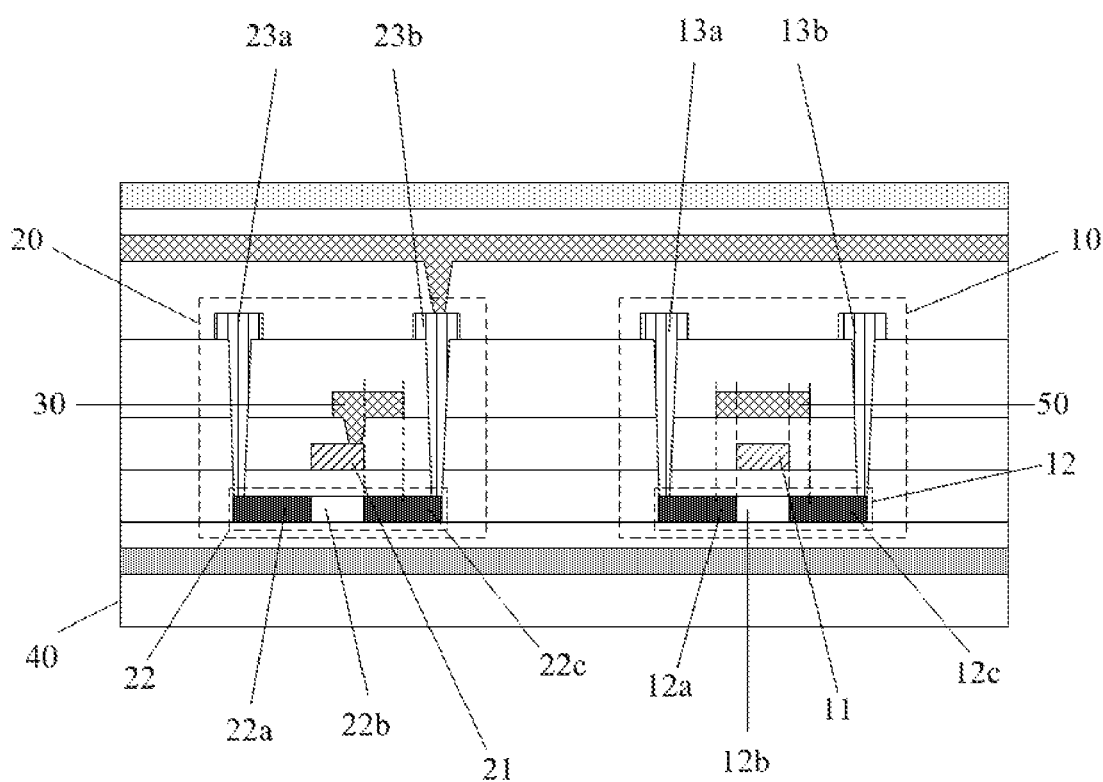
FIG. 3 illustrates a cross sectional view of a part of a pixel circuit according to one embodiment of the present disclosure.

Specifically, in a second case, a schematic diagram of components of a gate capacitor corresponding to a structure illustrated in FIG. 3 is illustrated in FIG. 8, the orthogonal projection of the first auxiliary electrode 30 on the underlying substrate 40 and the orthogonal projection of the active layer 22c closest to the drain 23b of the corresponding switching transistor 20 on the underlying substrate 40 have a second overlapping area, such that the second capacitor $C_2$ is formed between the first auxiliary electrode 30 and the active layer (i.e., the active layer 22c closest to the drain 23b) in the second overlapping area. Since a capacitor $C_g$ is also formed between the gate 21 and the active layer (i.e., the portion 22b opposite the gate 21 in the active layer 22), the first capacitor $C_2$ and the capacitor $C_g$ form a parallel capacitor. Since parallel capacitance is equal to a sum of capacitance of both capacitors, when $C_{m2}$ represents the gate capacitance of the switching transistor 20, $C_{m2}=C_2+C_g$.

Figure 4:
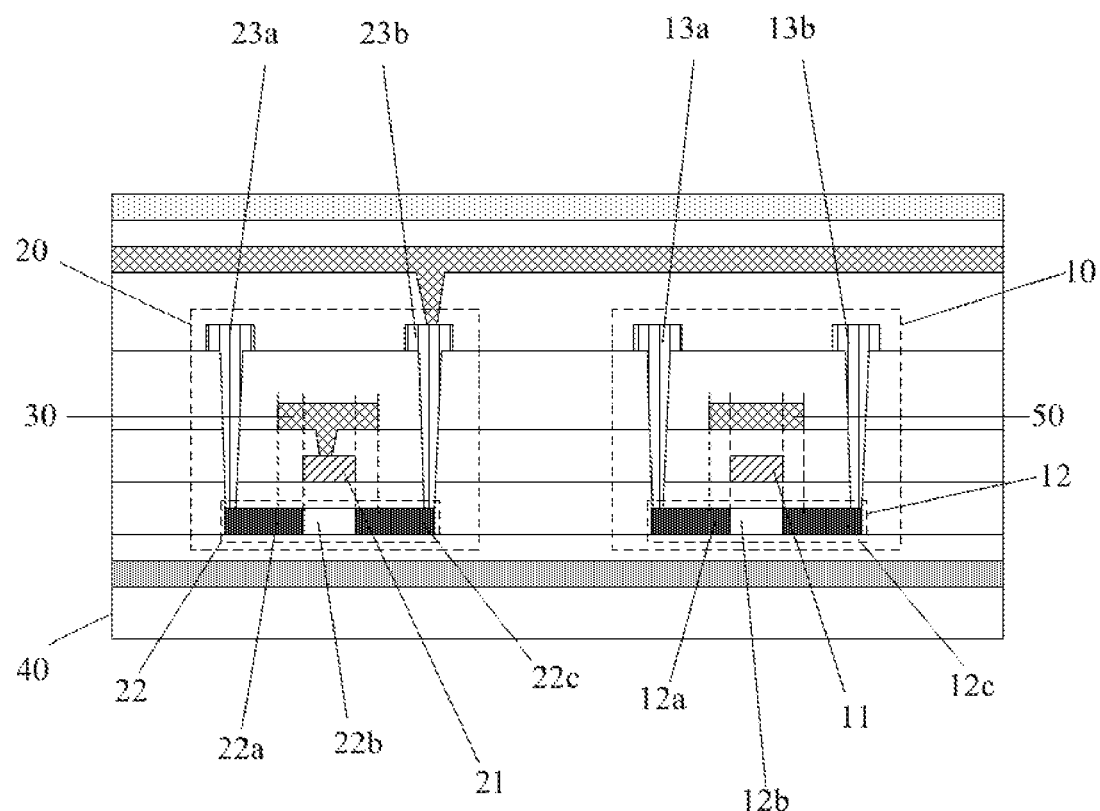
FIG. 4 illustrates a cross sectional view of a part of a pixel circuit according to one embodiment of the present disclosure.

Specifically, in a third case, a schematic diagram of components of a gate capacitor corresponding to a structure illustrated in FIG. 4 is illustrated in FIG. 9, not only the orthogonal projection of the first auxiliary electrode 30 on the underlying substrate 40 and the orthogonal projection of the active layer 22a closest to the source 23a in the corresponding switching transistor 20 on the underlying substrate 40 have a first overlapping area, but also the orthogonal projection of the first auxiliary electrode 30 on the underlying substrate 40 and the orthogonal projection of the active layer 22c closest to the drain 23b of the corresponding switching transistor 20 on the underlying substrate 40 have a second overlapping area. So that the first capacitor $C_1$ is formed between the first auxiliary electrode 30 and the active layer (i.e., the active layer 22a closest to the source 23a) in the first overlapping area, and the second capacitor $C_2$ is formed between the first auxiliary electrode 30 and the active layer (i.e., the active layer 22c closest to the drain 23b) in the second overlapping area. Since a capacitor $C_g$ is also formed between the gate 21 and the active layer (i.e., the portion 22b opposite the gate 21 in the active layer 22), the first capacitor $C_1$, the second capacitor $C_2$ and the capacitor $C_g$ form a parallel capacitor. Since parallel capacitance is equal to a sum of capacitance of all capacitors, when $C_{m3}$ represents the gate capacitance of the switching transistor 20, $C_{m3}=C_1+C_2+C_g$.

Moreover, in order to electrically connect a first auxiliary electrode with a gate of a corresponding transistor, in the pixel circuit according to the embodiment of the present disclosure, as illustrated in FIG. 2 to FIG. 6, each first auxiliary electrode 30 is electrically connected with the gate 21 of the corresponding switching transistor 20 through a via hole.

During an actual implementation, in order to indirectly increase the subthreshold swing of the driving transistor, the gate capacitance of the driving transistor does not need to be changed. Therefore, in the pixel circuit according to the embodiment of the present disclosure, as illustrated in FIG. 2 to FIG. 6, the pixel circuit may further include a second auxiliary electrode 50. The second auxiliary electrode 50 and the gate 11 of the driving transistor 10 form a storage capacitor $C_s$.

Figure 10:
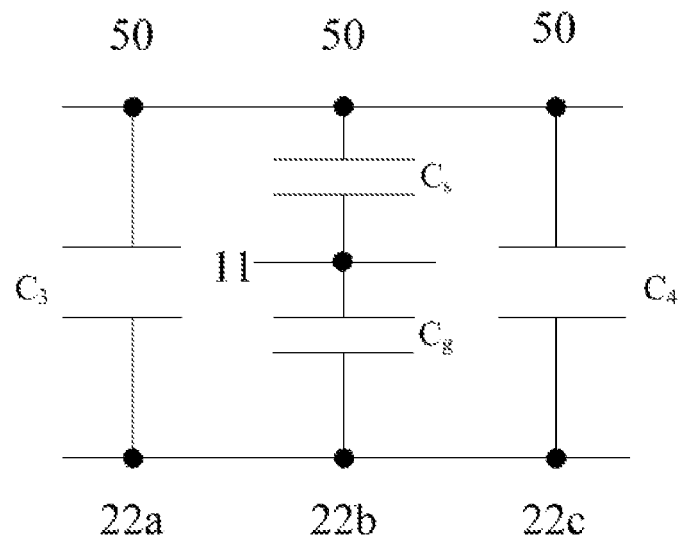
FIG. 10 illustrates a schematic diagram of gate capacitor assembly in a driving transistor according to an embodiment of the present disclosure.
Figure 11:
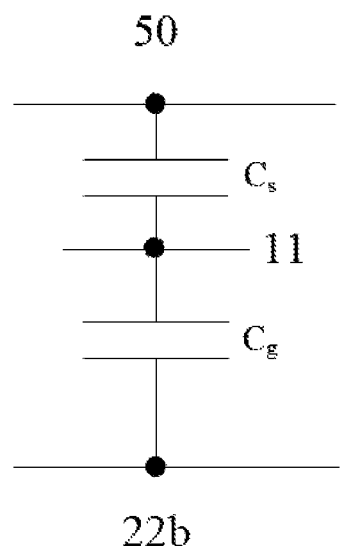
FIG. 11 illustrates a schematic diagram of gate capacitor assembly in a driving transistor according to an embodiment of the present disclosure.

Specifically, in order to simplify the fabrication process, the second auxiliary electrode may be fabricated when the first auxiliary electrode is fabricated, and the area of the first auxiliary electrode may be the same as the area of the second auxiliary electrode to simplify the process for and the difficulty in fabricating a mask. Therefore, in the pixel circuit according to the embodiment of the present disclosure, for the driving transistor illustrated in FIG. 2 to FIG. 4, an orthogonal projection of the second auxiliary electrode 50 on the underlying substrate 40 and an orthogonal projection of an active layer 12 on the underlying substrate 40 have an overlapping area, and components of a specific gate capacitor are illustrated in FIG. 10. A capacitor formed between the second auxiliary electrode 50 and the active layer 12a closest to a source 13a is represented by $C_3$, a capacitor formed between the second auxiliary electrode 50 and the active layer 12c closest to a drain 13b is represented by $C_4$, and a capacitor formed between the gate 11 and the active layer (i.e., the portion 12b opposite the gate 11 in the active layer 12) is represented by $C_g$. Since parallel capacitance is equal to a sum of capacitance of all capacitors and serial capacitance is equal to a sum of reciprocals of capacitance of all capacitors, when $C_{n1}$ is used for representing the gate capacitance of the driving transistor 10, $C_{n1}=C_3+C_4+(1/C_s+1/C_g)$; and $C_1=C_3$, $C_2=C_4$.

Moreover, when the orthogonal projection of the second auxiliary electrode on the underlying substrate and the orthogonal projection of the active layer on the underlying substrate have an overlapping area, as illustrated in FIG. 2 to FIG. 4, it may be that only one side of the active layer and the second auxiliary electrode have an overlapping area, or both sides of the active layer and the second auxiliary electrode have overlapping areas, which are not specifically limited herein.

Of course, when the second auxiliary electrode is fabricated, the area of the second auxiliary electrode may also be different from the area of the first auxiliary electrode. Therefore, in the pixel circuit according to the embodiment of the present disclosure, for the driving transistor illustrated in FIG. 5 and FIG. 6, the orthogonal projection of the second auxiliary electrode 50 on the underlying substrate 40 and the orthogonal projection of the active layer 12 on the underlying substrate 40 do not have an overlapping area, i.e., there are only the storage capacitor $C_s$ included of the second auxiliary electrode 50 and the gate 11 of the driving transistor 10 and the capacitor $C_g$ formed between the gate 11 and the active layer (i.e., the portion 12b opposite the gate 11 in the active layer 12), so as to prevent the capacitor formed between the second auxiliary electrode 50 and the active layer 12 from influencing a gate signal. However, it is noteworthy that, since the first auxiliary electrode 30 in the switching transistor 20 is electrically connected with the gate 22 of the corresponding switching transistor 20, such that the first auxiliary electrode 30 and the gate 21 of the corresponding switching transistor 20 have the same potential, the influences of the first capacitor $C_1$ and the second capacitor $C_2$ on the gate signal are far smaller than the influences of $C_3$ and $C_4$ in the driving transistor 10 on the gate signal. Since parallel capacitance is equal to a sum of capacitance of both capacitors and serial capacitance is equal to a sum of reciprocals of capacitance of both capacitors, when $C_{n2}$ is used for representing the gate capacitance of the driving transistor 10, $C_{n2}=1/C_s+1/C_g$ at this moment.

To sum up, from the above-mentioned description, it can be seen that the gate capacitance of the switching transistor 20 may be: $C_{m1}=C_1+C_g$, $C_{m2}=C_2+C_g$, $C_{m3}=C_1+C_2+C_g$; and the gate capacitance of the driving transistor 10 may be: $C_{n1}=C_3+C_4+(1/C_s+1/C_g)$, $C_1=C_3$, $C_2=C_4$, and $C_{n2}=1/C_s+1/C_g$. Therefore, no matter which one of numerical values of $C_s$, $C_1$ (or $C_3$), $C_2$ (or $C_4$) and $C_g$ is greater or smaller, $1/C_s+1/C_g$ is definitely smaller than $C_g$. As a result, the final gate capacitance of the switching transistor 20 is definitely greater than the gate capacitance of the driving transistor 10. Therefore, the subthreshold swing of the switching transistor 20 is definitely smaller than the subthreshold swing of the driving transistor 10. In this way, the display uniformity of the displayed image is improved.

Of course, the numerical values of $C_1$, $C_2$, $C_3$ and $C_4$ and the ratio of the size of the overlapping area of the orthogonal projection of the gate of the switching transistor on the underlying substrate and the orthogonal projection of the active layer on the underlying substrate to the sizes of both orthogonal projections may be correspondingly designed and adjusted according to actual needs, as long as the subthreshold swing of the driving transistor can be increased and the display uniformity of the displayed image can be improved through design of the gate capacitance, which are not specifically limited herein.

During actual implementation, all switching transistors and the driving transistor in the pixel circuit may be top-gate transistors and may also be bottom-gate transistors. Moreover, since position relationships among the gate and the active layer and the source/drain are different in different types of transistors, the positions of the first auxiliary electrode and the second auxiliary electrode may change accordingly, thus discussion is carried out according to different situations as follows.

Specifically, when all the switching transistors and the driving transistor are top-gate transistors, in the pixel circuit according to the embodiment of the present disclosure, as illustrated in FIG. 2 to FIG. 4, the gate 21 of each switching transistor 20 is located in a film layer between the active layer 22 and the source/drain of each switching transistor 20; the gate 11 of the driving transistor 10 is located in a film layer between the active layer 12 and the source/drain of the driving transistor 10; each first auxiliary electrode 30 may be arranged in a film layer between the gate 21 and the source/drain of a corresponding switching transistor 20. Since the second auxiliary electrode 50 is also located in the film layer between the gate 11 and the source/drain of the driving transistor 10, the first auxiliary electrode 30 may be made of a same material and be arranged in a same layer as the second auxiliary electrode 50 to simplify the fabrication process and to reduce the fabrication cost.

Figure 5:
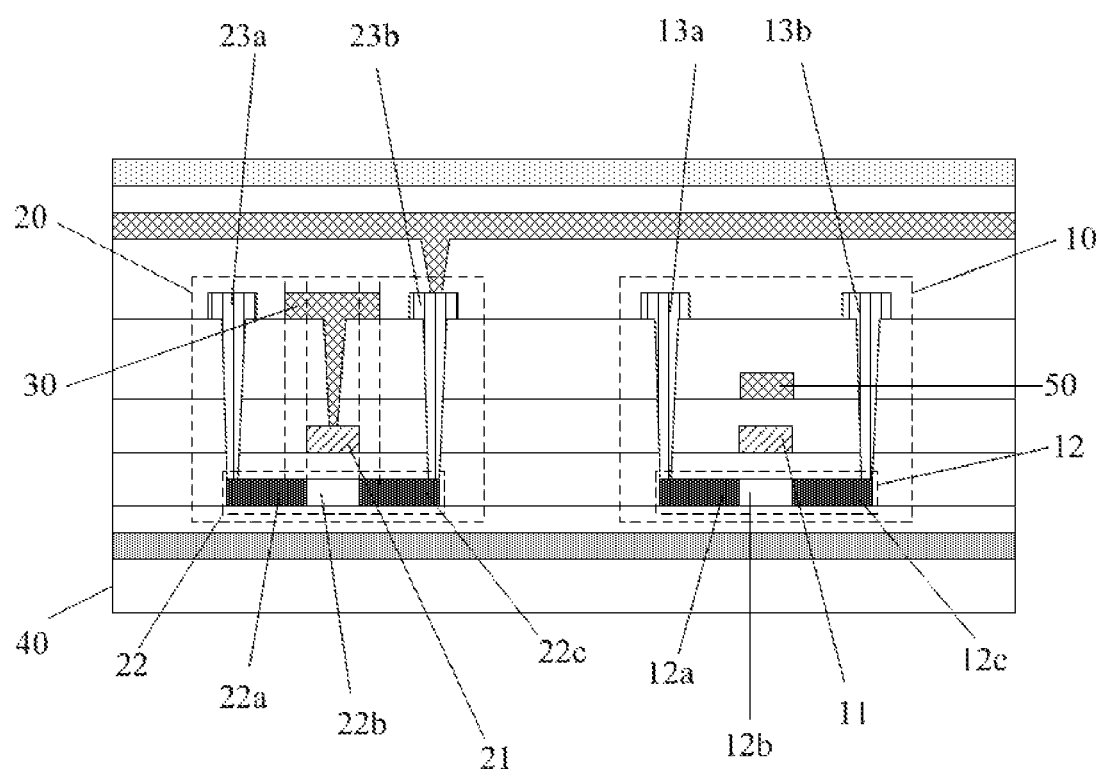
FIG. 5 illustrates a cross sectional view a part of a pixel circuit according to an embodiment of the present disclosure.

Of course, in the pixel circuit according to the embodiment of the present disclosure, when all the switching transistors 20 and the driving transistor 10 are top-gate transistors, as illustrated in FIG. 5, the gate 21 of each switching transistor 20 is located in a film layer between the active layer 22 and the source/drain of each switching transistor 20, and the gate 11 of the driving transistor 10 is located in a film layer between the active layer 12 and the source/drain of the driving transistor 10. Moreover, each first auxiliary electrode 30 may be made of the same material and be provided in the same layer as the source/drain of a corresponding switching transistor 20. Since the second auxiliary electrode 50 is provided in the film layer between the gate 11 and the source/drain of the driving transistor 10, the pattern of the mask does not need to be changed when the second auxiliary electrode 50 is fabricated, and the pattern of the mask is changed only when the source/drain is fabricated, such that each first auxiliary electrode 30 could be fabricated while the source/drain is fabricated, so as to simply the fabrication process and reduce the fabrication cost.

Figure 6:
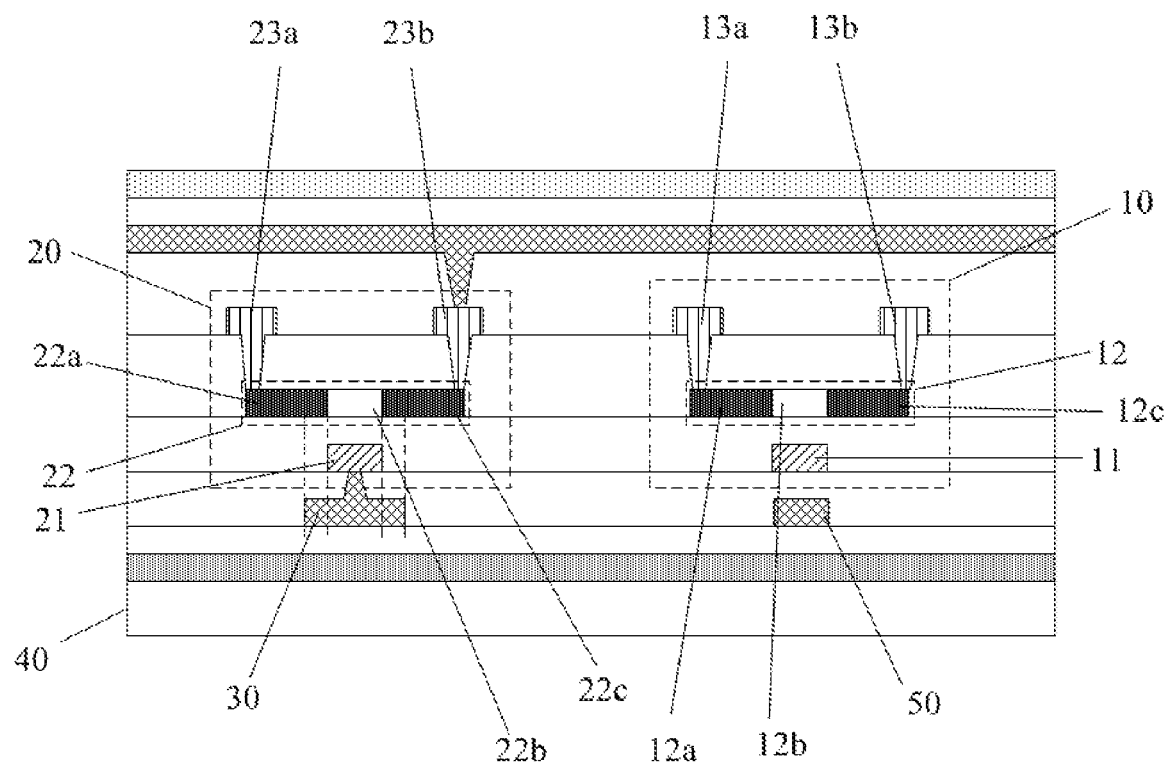
FIG. 6 illustrates a cross sectional view of a part of a pixel circuit according to an embodiment of the present disclosure.

Specifically, when all switching transistors and the driving transistor are bottom-gate transistors, in the pixel circuit according to the embodiment of the present disclosure, as illustrated in FIG. 6, the gate 21 of each switching transistor 20 is located in a film layer between the active layer 22 of the switching transistor 20 and the underlying substrate 40; the gate 11 of the driving transistor 10 is located in a film layer between the active layer 12 of the driving transistor 10 and the underlying substrate 40; each first auxiliary electrode 30 may be provided in the film layer between the underlying substrate 40 and the gate 21 of the corresponding switching transistor 20; and simultaneously, since the second auxiliary electrode 50 is also located in the film layer between the gate 11 and the underlying substrate 40, the first auxiliary electrode 30 may be made of the same material and be provided in the same layer as the second auxiliary electrode 50, so as to simplify the fabrication process and reduce the fabrication cost.

During actual implementation, in the pixel circuit according to the embodiment of the present disclosure, schematic diagrams of hierarchical structures of a part of a pixel circuit illustrated in FIG. 2 to FIG. 6 correspond to the pixel circuit illustrated in FIG. 1, where the switching transistor 20 may correspond to a fifth switching transistor T5 in the pixel circuit, and thus a drain 23b thereof is electrically connected with an anode of a light emitting unit. Of course, the structure of the pixel circuit is not limited to the structure illustrated in FIG. 1 and may also be another structure. When no switching transistor is provided between the driving transistor in the pixel circuit and the light emitting diode, the anode of the light emitting unit can be electrically connected with the drain of the driving electrode, which is not specifically limited herein.

Figure 12A:
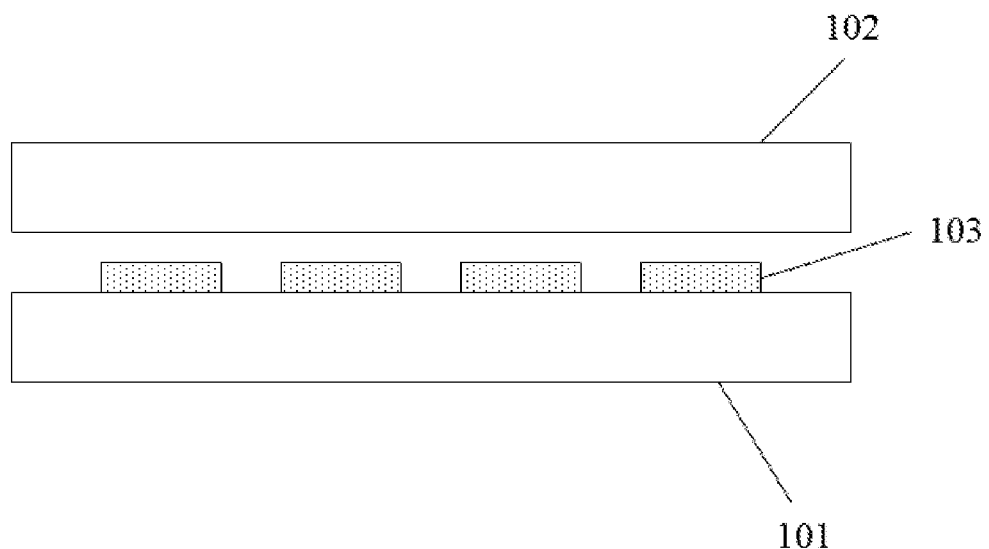
FIG. 12A illustrates a schematic structural diagram of a display panel according to an embodiment of the present disclosure.

Based on the same inventive concept, the embodiment of the present disclosure further provides a display panel, which may include pixel circuits arranged in an array according to the embodiment of the present disclosure. Specifically, as illustrated in FIG. 12A which illustrates a side view, the display panel 100 includes an array substrate 101 and a packaging substrate 102 which are disposed face to face, and pixel circuits 103 arranged in an array are provided on one side of the array substrate 101 opposite the packaging substrate 102.

Figure 12B:
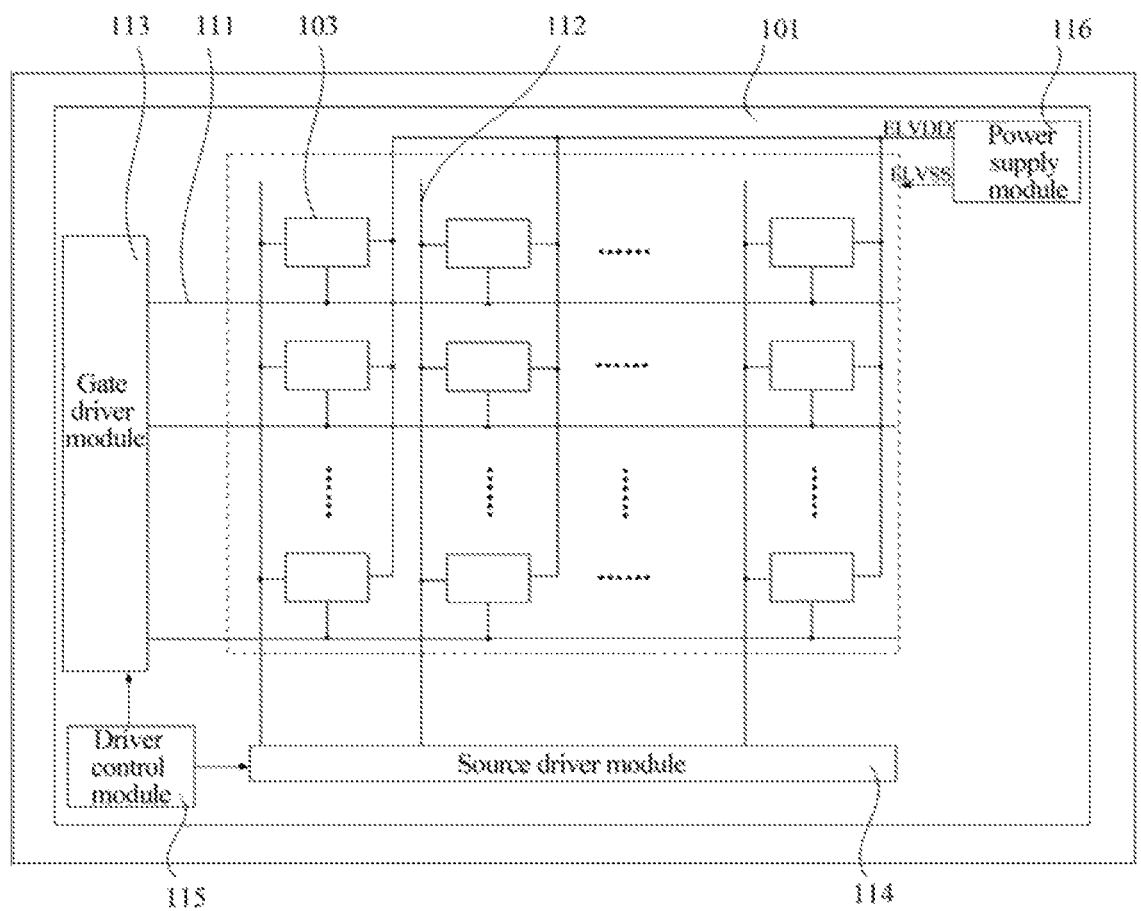
FIG. 12B illustrates a schematic circuit diagram of a display panel according to an embodiment of the present disclosure.

Optionally, as illustrated by FIG. 12B, which is a top view of the display panel and in which no packaging substrate 102 is shown, scan signal lines 111, data signal lines 112, a gate driver module 113, a source driver module 114, a driver control module 115 and a power supply module 116 can be arranged on the array substrate 101. Pixel circuits 103 can be arranged in space formed by intersections of the scan signal lines 111 and data signal lines 112. The display panel can display an image by the following operations: the gate driver module 113 inputs a scan signal to a corresponding pixel circuit 103 by way of the power supply module 116 in response to a scan driver control signal generated by the scan driver control module 115; a current flows to a data signal line 112 electrically connected with the pixel circuit 103 from the pixel circuit 103 under the influence of the scan signal input by a scan signal line 111 electrically connected with the pixel circuit 103; the source driver module 131 inputs a data signal to the corresponding pixel circuit 103 via the data signal line 112 in response to a data driver control signal generated by the driver control module 115; and the power supply module 116 provides a first pixel power supply ELVDD and a second pixel power supply ELVSS to the pixel circuit 103.

Figure 13:
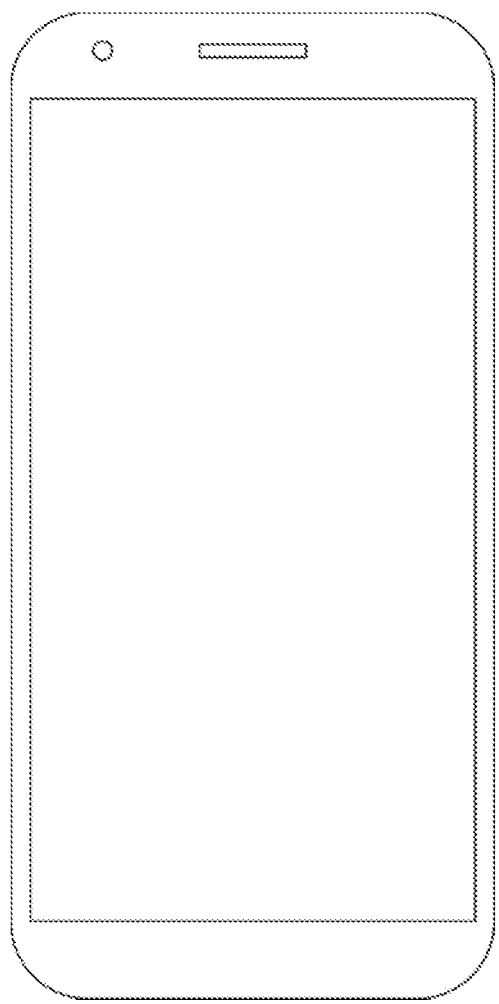
FIG. 13 illustrates a schematic diagram of a display device according to an embodiment of the present disclosure.

Based on the same inventive concept, the embodiment of the present disclosure further provides a display device, which may include the display panel according to the embodiment of the present disclosure. The display device may be any product or component having a display function such as a mobile phone (as illustrated in FIG. 13), a tablet computer, a television, a display, a notebook computer, a digital photo frame and a navigator. For the implementation of the display device, a reference may be made to the above-mentioned embodiment of the display panel, and details are not repetitively described herein.

The embodiment of the present disclosure provides a display panel and a display device. The display panel includes pixel circuits arranged in an array. Each pixel circuit includes a driving transistor, at least two switching transistors and at least two first auxiliary electrodes arranged corresponding to the switching transistors in a one-to-one relationship. An first auxiliary electrode is electrically connected with a gate of a corresponding switching transistor, and an orthogonal projection of the first auxiliary electrode on an underlying substrate and an orthogonal projection of an active layer in the corresponding switching transistor on the underlying substrate have an overlapping area, and a capacitor is formed between the first auxiliary electrode and the active layer in the overlapping area. Therefore, by electrically connecting the first auxiliary electrode with the gate of the corresponding switching transistor, the first auxiliary electrode and the gate of the corresponding switching transistor have the same potential. Since the potential of the active layer is different from the potential of the gate, a capacitor can be formed between the first auxiliary electrode and the active layer and a capacitor is also formed between the gate and the active layer to form a parallel gate capacitor. In the driving transistor, since the first auxiliary electrode electrically connected with the gate does not exist, the total gate capacitance after serial connection in the driving transistor is smaller than the gate capacitance after parallel connection in each switching transistor, such that a subthreshold swing of the driving transistor is greater than a subthreshold swing of each switching transistor, and the uniformity of the displayed image is improved.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

What is claimed is:

1. A display panel, comprising a plurality of pixel circuits arranged in an array, wherein each of the plurality of pixel circuits comprises:
    a driving transistor;
    at least two single gate switching transistors;
    at least two first auxiliary electrodes each is electrically connected with a gate of one of the at least two single gate switching transistors in a one to one relationship; and
    a capacitor is formed in an overlapping area between one of the at least two first auxiliary electrodes and an active layer of the connected single gate switching transistor, and wherein the gate of the connected single gate switching transistor is located in a layer between the first auxiliary electrode and the active layer of the connected single gate switching transistor.

2. The display panel according to claim 1, wherein a first capacitor is formed in an overlapping area between one of the at least two first auxiliary electrodes and an active layer next to a source in the connected single gate switching transistor; and/or,
    wherein a second capacitor is formed in an overlapping area between one of the at least two first auxiliary electrodes and an active layer next to a drain of the connected single gate switching transistor.

3. The display panel according to claim 1, wherein each of the at least two first auxiliary electrodes is electrically connected with the gate of the connected single gate switching transistor through a via hole.

4. The display panel according to claim 1, wherein the pixel circuit further comprises a second auxiliary electrode; and wherein the second auxiliary electrode and a gate of the driving transistor form a storage capacitor.

5. The display panel according to claim 4, wherein the gate of each of the at least two single gate switching transistors is located in a film layer between an active layer and a source or drain of the single gate switching transistor; wherein the gate of the driving transistor is located in a film layer between the active layer and the source/drain of the driving transistor; and
    wherein both of the at least two first auxiliary electrodes are made of a same material and are provided in a same layer as the source or drain of the connected single gate switching transistor.

6. The display panel according to claim 5, wherein the second auxiliary electrode is provided in a film layer between the gate and the source/drain of the driving transistor.

7. The display panel according to claim 4, wherein the gate of each of the at least two single gate switching transistors is located in a film layer between the active layer and a source/drain of said connected single gate switching transistor; wherein the gate of the driving transistor is located in a film layer between an active layer and a source/drain of the driving transistor; and wherein each of the at least two first auxiliary electrodes is provided in a film layer between the gate and the source/drain of the connected single gate switching transistor.

8. The display panel according to claim 7, wherein the at least two first auxiliary electrodes and the second auxiliary electrode are made of a same material and are provided in a same layer.

9. The display panel according to claim 4, wherein the gate of each of the at least two single gate switching transistors is located in a film layer between an active layer in the connected single gate switching transistor and the underlying substrate; wherein the gate of the driving transistor is located in a film layer between an active layer in the driving transistor and the underlying substrate; and wherein the first auxiliary electrode is provided in a film layer between the underlying substrate and the gate of the connected single gate switching transistor.

10. The display panel according to claim 9, wherein the at least two first auxiliary electrodes and the second auxiliary electrode are made of a same material and are provided in a same layer.

11. A display device, wherein the display device comprises a plurality of pixel circuits arranged in an array, wherein each of the plurality of pixel circuits comprises:
a driving transistor;
at least two single gate switching transistors; and
at least two first auxiliary electrodes each connected with one of the at least two single gate switching transistors in a one to one relationship;
and
wherein a capacitor is formed in an overlapping area between the first auxiliary electrode and an active layer in the connected single gate switching transistor, and the gate of the connected single gate switching transistor is located in a layer between the first auxiliary electrode and the active layer in the connected single gate switching transistor.

* * * * *